United States Patent
Wu et al.

(10) Patent No.: US 11,818,971 B2
(45) Date of Patent: Nov. 14, 2023

(54) PCM CELL WITH RESISTANCE DRIFT CORRECTION

(71) Applicant: INTERNATIONAL BUSINESS MACHINES CORPORATION, Armonk, NY (US)

(72) Inventors: Heng Wu, Santa Clara, CA (US); Ruilong Xie, Niskayuna, NY (US); Nanbo Gong, White Plains, NY (US); Cheng-Wei Cheng, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/977,336

(22) Filed: Oct. 31, 2022

(65) Prior Publication Data
US 2023/0047004 A1    Feb. 16, 2023

Related U.S. Application Data

(62) Division of application No. 16/735,759, filed on Jan. 7, 2020, now Pat. No. 11,563,173.

(51) Int. Cl.
*H10N 70/00* (2023.01)
*H10B 63/00* (2023.01)
*H10N 70/20* (2023.01)

(52) U.S. Cl.
CPC ......... *H10N 70/8613* (2023.02); *H10B 63/00* (2023.02); *H10N 70/063* (2023.02); *H10N 70/068* (2023.02); *H10N 70/231* (2023.02); *H10N 70/8828* (2023.02)

(58) Field of Classification Search
CPC ... H01L 45/06; H01L 45/065; H01L 45/1675; H01L 45/1691; H01L 45/1233; H01L 45/124; H10N 70/231; H10N 70/235; H10N 70/063; H10N 70/068; H10N 70/826; H10N 70/8265; G11C 13/0004; G11C 11/5678
See application file for complete search history.

(56) References Cited

U.S. PATENT DOCUMENTS

| | | |
|---|---|---|
| 6,914,801 B2 | 7/2005 | Kostylev et al. |
| 7,936,593 B2 | 5/2011 | Savransky |
| 8,178,386 B2 | 5/2012 | Lung et al. |
| 8,633,464 B2 | 1/2014 | Breitwisch et al. |
| 9,293,199 B2 | 3/2016 | Krebs et al. |
| 9,570,169 B1 | 2/2017 | Czornomaz et al. |
| 9,576,650 B2 | 2/2017 | Sebastian et al. |
| 9,640,757 B2 | 5/2017 | Zheng |
| 2008/0272358 A1* | 11/2008 | Lin ............... H10N 70/8828 257/E47.001 |

(Continued)

OTHER PUBLICATIONS

List of IBM Patents or Patent Applications Treated as Related dated Oct. 31, 2022, 2 pages.

(Continued)

*Primary Examiner* — Amar Movva
(74) *Attorney, Agent, or Firm* — Tutunjian & Bitetto, P.C.

(57) ABSTRACT

Phase change memory devices and methods of forming the same include forming a fin structure from a first material. A phase change memory cell is formed around the fin structure, using a phase change material that includes two solid state phases at an operational temperature.

19 Claims, 5 Drawing Sheets

(56) References Cited

U.S. PATENT DOCUMENTS

2014/0367630 A1    12/2014    Asano

OTHER PUBLICATIONS

Jing Li et al., "Explore Physical Origins of Resistance Drift in Phase Change Memory and its Implication for Drift-insensitive Materials", 2011 International Electron Devices Meeting, Washington, DC, Dec. 2011.

* cited by examiner

PCM CELL WITH RESISTANCE DRIFT CORRECTION

BACKGROUND

The present invention generally relates to phase change memory (PCM) devices and, more particularly, to PCM devices with structures to improve heater efficiency and decrease resistance drift.

PCM cells can be used to store information and perform in memory data processing in applications such as, e.g., hardware-based neural networks. PCM cells generally provide the ability to change the resistance of the cell by partially changing the solid-state phase of the cell. The cell starts in a first phase (e.g., an amorphous phase) and is progressively changed to a second phase (e.g., a crystalline phase). The two phases exhibit different resistances, so as the proportion of the cell in each phase changes, so too does the resistance of the cell. Each cell thus provides the ability to continuously change the resistance of the cell from its initial value, when it is in its initial phase, to a final value, when it is in its second phase.

However, PCM cells suffer from resistance drift, causing imprecision in the stored resistance value. Additionally, high currents can be needed to generate sufficient heat to change the cell's phase, resulting in high power requirements.

SUMMARY

A method of forming a phase change memory device includes forming a fin structure from a first material. A phase change memory cell is formed around the fin structure, using a phase change material that includes two solid state phases at an operational temperature.

A method of forming a phase change memory device includes forming a bottom electrode on a substrate. A heater is formed on the bottom electrode. A fin structure is formed from a first material on the heater. A phase change memory cell is formed around the fin structure, using a phase change material that includes two solid state phases at an operational temperature. A top electrode is formed on the phase change memory cell and the fin structure.

A phase change memory device includes a central structure formed from a first material. A phase change memory cell is formed around the central structure, from a phase change material that includes two solid state phases at an operational temperature.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide phase change memory (PCM) structures that include a high resistance internal liner. The high-resistance liner helps control resistance drift in the PCM structure and decreases the interface area between a heater and the PCM cell, thereby increasing resistance and the amount of heat that is generated.

Figure 1:
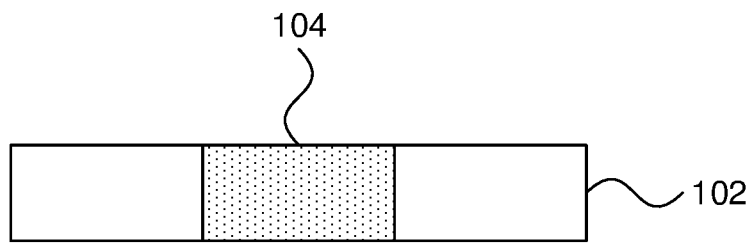
FIG. 1 is a cross-sectional diagram of a step in the formation of a phase change memory (PCM) device with low resistance drift that shows the formation of a bottom electrode in a substrate in accordance with an embodiment of the present invention.

Referring now to FIG. 1, a cross-sectional view of a step in the formation of a PCM cell is shown. A bottom electrode 104 is formed in a substrate 102. The substrate 102 can be formed from any appropriate material. In some embodiments, the substrate 102 can be a dielectric material, for example formed from silicon dioxide or any other high- or low-k dielectric material. In some embodiments, the substrate 102 can be a top layer of a multi-layer integrated chip, where additional devices and layers (not shown) can be positioned below the substrate 102 to provide interconnection and additional functionality to the PCM cell.

The bottom electrode 104 is formed from any appropriate conductive material. Exemplary materials for the bottom electrode 104 include metals, such as tungsten, nickel, titanium, molybdenum, tantalum, copper, platinum, silver, gold, ruthenium, iridium, rhenium, rhodium, and alloys thereof, and non-metals, such as doped semiconductor materials, like doped polysilicon. The bottom electrode 104 can be formed by, for example, etching a trench in the substrate 102 and depositing conductive material to fill the trench. In other embodiments, the bottom electrode 104 can be formed first by, e.g., photolithography, and the substrate 102 can be formed around the bottom electrode 104.

Figure 2:
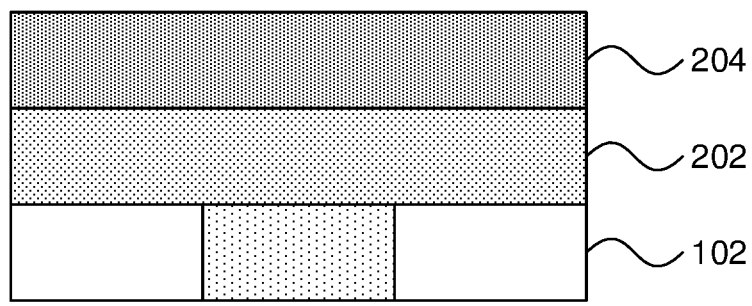
FIG. 2 is a cross-sectional diagram of a step in the formation of a PCM device with low resistance drift that shows the formation of a layer of heater material and a layer of high-resistance material in accordance with an embodiment of the present invention.

Referring now to FIG. 2, a cross-sectional view of a step in the formation of a PCM cell is shown. A layer 202 of heater material is formed on the substrate 102, over the bottom electrode 104, and a layer 204 of high-resistance material is formed over the layer 202 of heater material. In some embodiments, the layer 204 of high-resistance material can have a thickness between about 30 nm and about 100 nm.

The heater material can be formed from any material that is selected for its resistivity and its robustness to temperature change. Specific materials that are contemplated for the heater material include titanium nitride and tantalum nitride, but it should be understood that other materials can be used instead. The high-resistance material can similarly be formed from any material that is selected for its resistivity. A specific material that is contemplated for the high-resistance material includes titanium nitride, but it should be understood that other materials can be used instead. The layers 202 and 204 can be formed by any appropriate deposition process, including, e.g., chemical vapor deposition (CVD), physical vapor deposition (PVD), atomic layer deposition (ALD), or gas cluster ion beam (GCIB) deposition.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
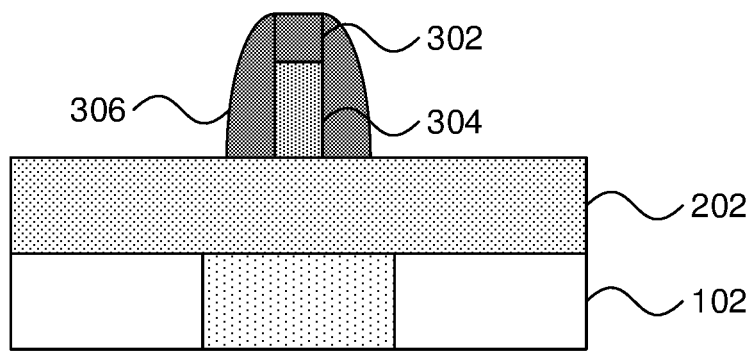
FIG. 3 is a cross-sectional diagram of a step in the formation of a PCM device with low resistance drift that shows the formation of a fin of high-resistance material and the formation of sidewall spacers on the fin in accordance with an embodiment of the present invention.

Referring now to FIG. 3, a cross-sectional view of a step in the formation of a PCM cell is shown. A hardmask 302 is formed over the layer 204 of high-resistance material by, e.g., photolithography or spacer image transfer. An anisotropic etch, such as a reactive ion etch (RIE) is used to etch the layer 204 of high-resistance material to form a high-resistance fin 304. Sidewall spacers 306 are formed on sides of the high-resistance fin 304.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. In alternative embodiments, the high-resistance fin 304 can be formed on the layer 202 of heater material by spacer image transfer.

The sidewall spacers 306 can be formed by conformally depositing a layer of sidewall material, for example by CVD, and then using an anisotropic etch to remove the sidewall material from horizontal surfaces. In some embodiments, both the hardmask 302 and the sidewall spacers 306 can be formed from a same material, such as silicon nitride. In other embodiments, the two structures can be formed from differing dielectric materials.

It is specifically contemplated that the anisotropic etches that are used to form the high-resistance fin 304 and the sidewall spacers 306 are selective etches. As used herein, the term "selective," in reference to a material removal process, denotes that the rate of material removal for a first material is greater than the rate of removal for at least another material of the structure to which the material removal process is being applied. Thus, the etch of the high-resistance material stops on the etch of the heater material, leaving the heater material relatively undamaged. In embodiments where the high-resistance material and the heater material are both the same, for example using titanium nitride, then a timed etch can be used instead.

In some embodiments, the hardmask 302 and the high-resistance fin 304 can have a width between about 6 nm and about 20 nm, and the high-resistance fin can have a height-to-width ratio of about 10. In some embodiments, the sidewall spacers can have a thickness between about 5 nm and about 20 nm. Although the ranges described herein are specifically contemplated, it should be understood that other values for the described thicknesses can be used as well.

Figure 4:
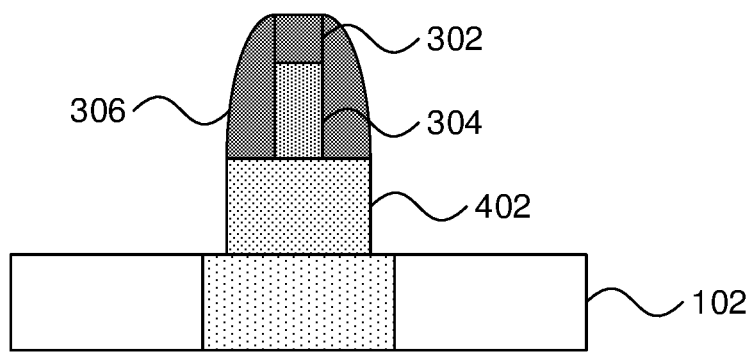
FIG. 4 is a cross-sectional diagram of a step in the formation of a PCM device with low resistance drift that shows the formation of a heater from the layer of heater material, using the high-resistance fin and the sidewall spacers as a mask, in accordance with an embodiment of the present invention.

Referring now to FIG. 4, a cross-sectional view of a step in the formation of a PCM cell is shown. The hardmask 302 and the sidewall spacers 306 are used as a lithographic mask for a selective, anisotropic etch of the layer 202 of heater material, forming the heater 402. It is specifically contemplated that the heater can have a thickness of 20 nm or larger.

Figure 5:
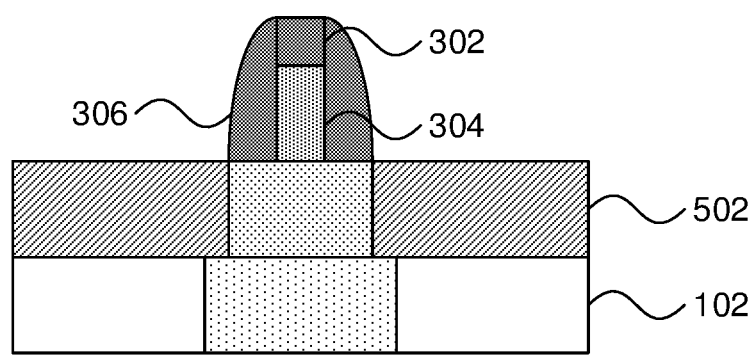
FIG. 5 is a cross-sectional diagram of a step in the formation of a PCM device with low resistance drift that shows the formation of an interlayer dielectric around the heater in accordance with an embodiment of the present invention.

Referring now to FIG. 5, a cross-sectional view of a step in the formation of a PCM cell is shown. A dielectric layer 502 is formed by depositing a dielectric material, such as silicon dioxide using a flowable deposition process, and anisotropically etching the dielectric material back to the height of the heater 402. In some embodiments, the anisotropic etch can be timed to set the height of the dielectric layer 502.

Figure 6:
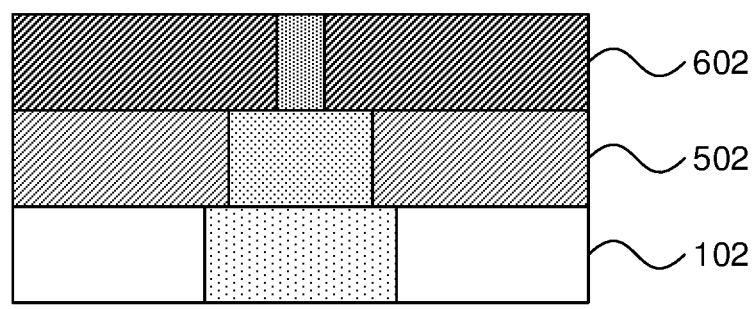
FIG. 6 is a cross-sectional diagram of a step in the formation of a PCM device with low resistance drift that shows the formation of a layer of phase change material around the high-resistance fin in accordance with an embodiment of the present invention.

Referring now to FIG. 6, a cross-sectional view of a step in the formation of a PCM cell is shown. A layer 602 of phase-change material is deposited by any appropriate deposition process, followed by a chemical mechanical planarization (CMP) process to bring the height of the layer 602 to the same height as the high-resistance fin 304. CMP is performed using, e.g., a chemical or granular slurry and mechanical force to gradually remove upper layers of the device. The slurry may be formulated to be unable to dissolve, for example, the high-resistance material, resulting in the CMP process's inability to proceed any farther than that layer.

It is specifically contemplated that the phase-change material can include any appropriate material that can be progressively changed from one solid-state phase to another. Exemplary phase change materials include chromium-germanium-tellurium alloys, such as $Cr_2Ge_2Te_6$, germanium-antimony-tellurium alloys, such as $Ge_2Sb_2Te_5$, antimony-tellurium alloys, such as $Sb_2Te_3$, and germanium-tellurium alloys, such as GeTe. In some embodiments, the phase-change material can include doping by material such as, e.g., nitrogen.

Figure 7:
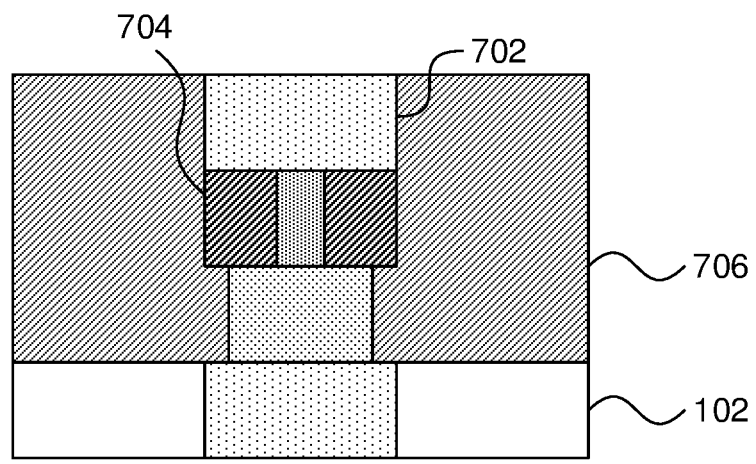
FIG. 7 is a cross-sectional diagram of a step in the formation of a PCM device with low resistance drift that shows the formation of a PCM cell from the layer of phase change material and the formation of a top electrode over the PCM cell in accordance with an embodiment of the present invention.

Referring now to FIG. 7, a cross-sectional view of a step in the formation of a PCM cell is shown. An top electrode 702 is formed over the high-resistance fin 304 and the layer 602 of phase-change material, and the layer 602 of phase-change material is etched to form PCM cell 704. The top electrode 702 can be formed from the same material as the bottom electrode 102, or from any other appropriate conductive material. A layer of dielectric material 706 can be formed around the PCM cell 704 from, e.g., silicon dioxide or any other appropriate dielectric material.

The present embodiments include multiple processes, by which the top electrode 702 and the PCM cell 704 can be formed. In some embodiments, the top electrode 702 can be formed by, for example, depositing a layer of conductive material, using a photolithographic process to form a mask, anisotropically etching to form the electrode, and etching away the mask. The top electrode 702 can then be used as a mask for an anisotropic etch of the layer 602 of phase change material to form the PCM cell 704. The structures can then be surrounded by dielectric layer 706 by, e.g., a flowable dielectric deposition, followed by CMP down to the top surface of the top electrode 702.

In other embodiments, the PCM cell 704 can be formed before the top electrode 702, for example using a photolithographic process to form a mask and using an anisotropic etch to remove the phase-change material that is not protected by the mask. An intermediate dielectric layer (not shown) can then be formed to the height of the PCM cell 704, and the top electrode 702 can be formed over the PCM cell 704. Additional dielectric material can then be added to complete the dielectric layer 706.

During operation, PCM cells can undergo a process called, "relaxation," whereby the phase distribution of the structure undergoes a gradual change from the higher-energy phase to the lower-energy phase, even when the temperature is below the phase transition temperature. This results in drift of the resistance value over time. Read currents accelerate this process, but simply reducing the applied voltage has the counter-intuitive effect of increasing the amount of relaxation and resistance drift.

The high-resistance fin 304 provides an alternative pathway for current to flow, thereby decreasing the amount of current that runs through the PCM cell 704, without decreasing the voltage. In some embodiments, the resistivity of the high-resistance fin 304 can be selected to be between the resistivity of the high-resistance phase of the phase-change material and the resistivity of the low-resistance phase of the phase change material.

In addition to mitigating resistance drift, the high-resistance fin 304 increases the efficiency of the heater 402. The surface area of the interface between the heater 402 and the PCM cell 704 is decreased by the presence of the high-resistance fin 304. This decreased area results in an increased interface resistance, thereby increasing the amount of heat that is generated by the heater 402 during a write operation, such that the phase state of the PCM cell 704 can be changed more quickly, and with less current.

Although the present embodiments are described with particular focus on a fin-based embodiment, it should be understood that the heater 402, the high-resistance fin 304, and the PCM cell 704 can be trimmed to form a pillar. In such embodiments, the length of these structures in the dimension perpendicular to the figures can be cut using a photolithographic mask and one or more anisotropic etches. Multiple such pillars can be cut from a single fin. In this manner, an array of PCM devices can be formed from multiple such fins. In pillar embodiments, the length and width of the structure, including PCM cell 704 and the high-resistance fin 304, has a ratio of 2:1 or less. In fin embodiments, the ratio is greater than 2:1.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 8:
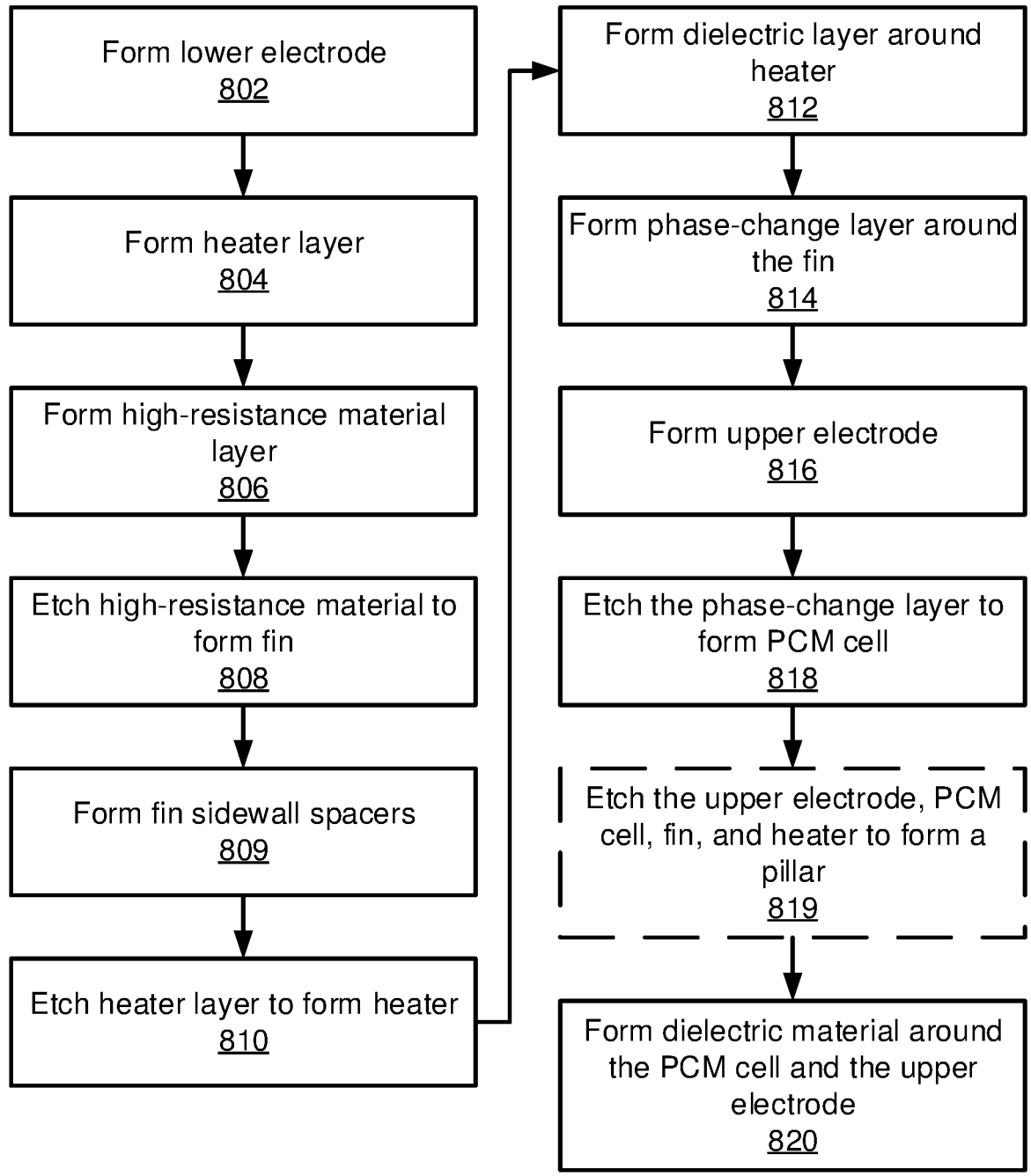
FIG. 8 is a block/flow diagram of a method for forming a PCM device with low resistance in accordance with an embodiment of the present invention.

Referring now to FIG. 8, a method for forming a PCM device is shown. Block 802 forms the bottom electrode 104 in a substrate 102. Block 804 forms the layer 202 of heater material over the bottom electrode 104, and block 806 forms the layer 204 of high-resistance material over the layer 202 of heater material. These layers can be formed by any appropriate deposition processes, including CVD, ALD, PVD, GCIB deposition, and so on.

Block 808 etches the layer 204 of high-resistance material to form a high-resistance fin 304. Block 809 forms sidewall spacers 306 on the high-resistance fin 304. Block 810 uses the mask created by the high-resistance fin 304 and the sidewall spacers 306 to anisotropically etch down into the layer 202 of heater material, forming heater 402. Block 812 forms a dielectric layer 502 around the heater 402 using, for example, a flowable deposition process.

Block 814 forms a layer 602 of phase-change material around the high-resistance fin 304 using any appropriate deposition process. Block 816 forms the top electrode and block 818 etches the layer 602 of phase-change material to form the PCM cell 704. Block 820 forms dielectric material around the PCM cell 704 and the top electrode 702. It should be understood that the order of these steps can be changed, for example by forming the PCM cell 704 before the top electrode is formed, and by splitting the formation of dielectric material in block 820 into multiple stages. Optionally, block 819 can trim the structures to form pillars, for example in an array of devices.

Figure 9:
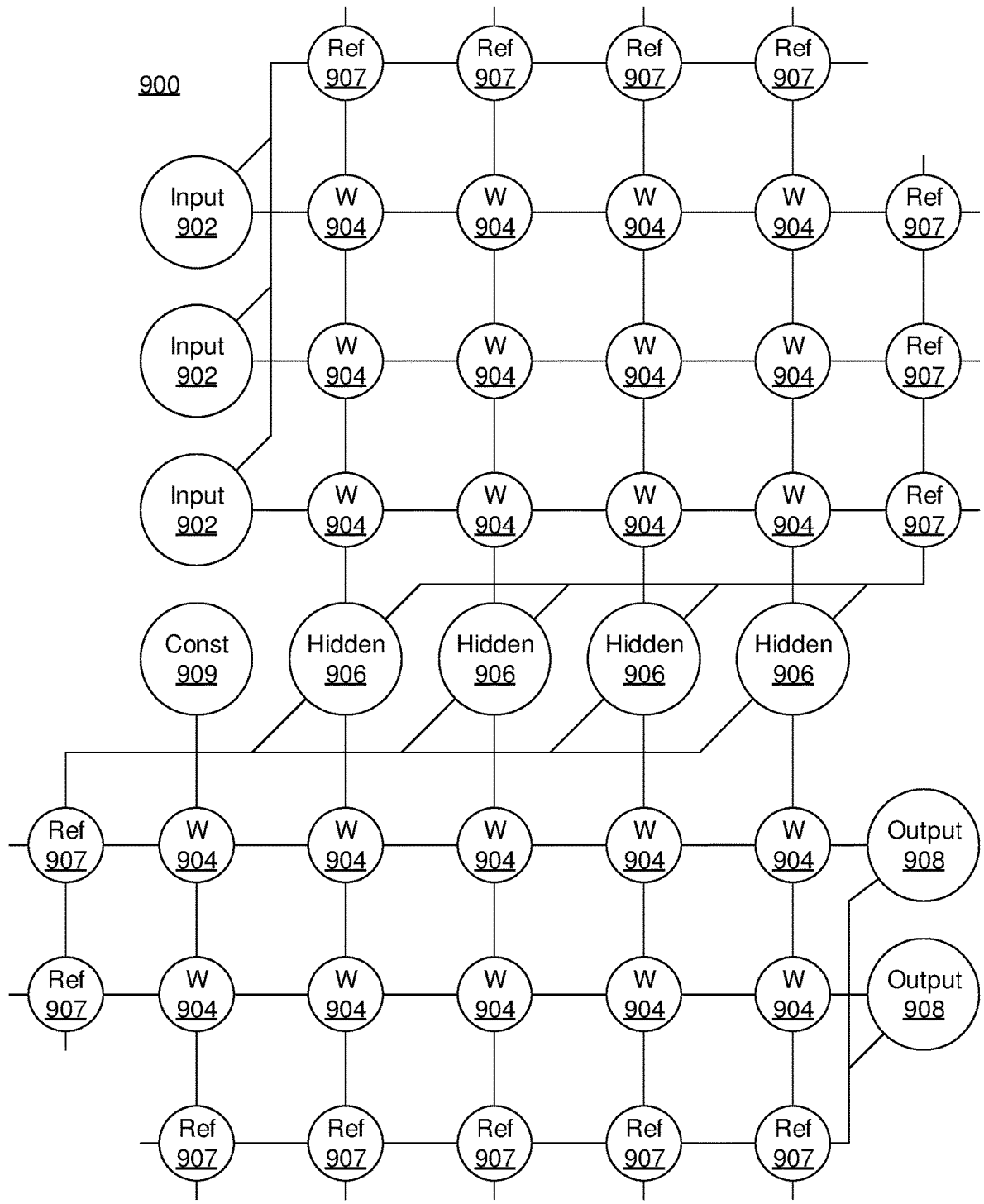
FIG. 9 is a block diagram of an exemplary artificial neural network architecture that uses PCM cells in weights in accordance with an embodiment of the present invention.

Referring now to FIG. 9, an artificial neural network (ANN) architecture 900 is shown that uses PCM devices to store synapse weights for in-memory computing. It should be understood that the present architecture is purely exemplary and that other architectures or types of neural network can be used instead. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, softmax layers, or any other appropriate type of neural network layer. Furthermore, layers can be added or removed as needed and the weights can be omitted for more complicated forms of interconnection.

During feed-forward operation, a set of input neurons 902 each provide an input voltage in parallel to a respective row of weights 904. In the hardware embodiment described herein, the weights 904 each have a settable resistance value, such that a current output flows from the weight 904 to a respective hidden neuron 906 to represent the weighted input. It is specifically contemplated that the weights 904 can be formed as PCM devices, as described above.

Following the hardware embodiment, the current output by a given weight 904 is determined as $I=V/r$, where V is the input voltage from the input neuron 902 and r is the set resistance of the weight 904. The current from each weight adds column-wise and flows to a hidden neuron 906. A set of reference weights 907 have a fixed resistance and combine their outputs into a reference current that is provided to each of the hidden neurons 906. Because conductance values can only be positive numbers, some reference conductance is needed to encode both positive and negative values in the matrix. The currents produced by the weights 904 are continuously valued and positive, and therefore the reference weights 907 are used to provide a reference current, above which currents are considered to have positive values and below which currents are considered to have negative values. As an alternative to using the reference weights 907, another embodiment can use separate arrays of weights 904 to capture negative values.

The hidden neurons 906 use the currents from the array of weights 904 and the reference weights 907 to perform some calculation. The hidden neurons 906 then output a voltage of their own to another array of weights 904. This array performs in the same way, with a column of weights 904 receiving a voltage from their respective hidden neuron 906 to produce a weighted current output that adds row-wise and is provided to the output neuron 908.

It should be understood that any number of these stages can be implemented, by interposing additional layers of arrays and hidden neurons 906. It should also be noted that some neurons can be constant neurons 909, which provide a constant output to the array. The constant neurons 909 can be present among the input neurons 902 and/or hidden neurons 906 and are only used during feed-forward operation.

During back propagation, the output neurons 908 provide a voltage back across the array of weights 904. The output layer compares the generated network response to training data and computes an error. The error is applied to the array as a voltage pulse, where the height and/or duration of the pulse is modulated proportional to the error value. In this example, a row of weights 904 receives a voltage from a respective output neuron 908 in parallel and converts that voltage into a current which adds column-wise to provide an input to hidden neurons 906. The hidden neurons 906 combine the weighted feedback signal with a derivative of its feed-forward calculation and stores an error value before outputting a feedback signal voltage to its respective column of weights 904. This back propagation travels through the entire network 900 until all hidden neurons 906 and the input neurons 902 have stored an error value.

In one exemplary embodiment of weight updates, the input neurons 902 and hidden neurons 906 apply a first weight update voltage forward and the output neurons 908 and hidden neurons 906 apply a second weight update voltage backward through the network 900. The combinations of these voltages create a state change within each weight 904, for example by heating the PCM cell in the weight 904 to cause a partial or complete change in the proportion of phases within the PCM device, causing the weight 904 to take on a new resistance value. In this manner the weights 904 can be trained to adapt the neural network 900 to errors in its processing. It should be noted that the three modes of operation, feed forward, back propagation, and weight update, do not overlap with one another.

In some embodiments, the arrays of weights 904 can be formed in a manner that share the bottom electrode 104 and/or top electrode 702, so that these electrodes form lines that connect devices. In such an embodiment, the top electrodes 702 may connect sets of PCM devices in a row-wise fashion, while the bottom electrodes 104 may connect sets of PCM devices in a column-wise fashion. In such embodiments, the lines formed by the top electrodes 702 and bottom electrodes 104 may connect to respective neurons.

Having described preferred embodiments of a PCM cell with resistance drift correction (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A phase change memory device, comprising:
a central structure formed from a first material;
a phase change memory cell, formed around the central structure and having an uppermost surface that extends no higher than an uppermost surface of the central structure, of a phase change material that includes two solid state phases at an operational temperature; and
a heater having an uppermost surface that is below a lowest surface of the central structure.

2. The phase change memory device of claim 1, wherein the central structure is in direct contact with the heater and thereby limits an interface area between the heater and the phase change memory cell.

3. The phase change memory device of claim 1, wherein the heater has a width that is smaller than a combined width of the central structure and the phase change memory cell.

4. The phase change memory device of claim 1, wherein the first material has a resistivity at the operational temperature that is between a resistivity of a first phase of the phase change material at the operational temperature and a resistivity of a second phase of the phase change material at the operational temperature.

5. The phase change memory device of claim 4, wherein the first material is titanium nitride and the phase change material is a germanium-antimony-tellurium alloy.

6. The phase change memory device of claim 1, wherein the central structure and the phase change memory cell are etched to a pillar structure.

7. The phase change memory device of claim 1, wherein the phase change memory cell runs along an entire height of sidewalls of the central structure.

8. The phase change memory device of claim 1, further comprising:
a top electrode over the central structure and the phase change memory cell; and
a bottom electrode under the central structure and the phase change memory cell.

9. A phase change memory device, comprising: a bottom electrode; a heater positioned on the bottom electrode; a central structure formed from a first material on the heater, the central structure having a lowermost surface that is above an uppermost surface of the heater; a phase change memory cell, formed around the central structure and on the heater and having an uppermost surface that extends no higher than an uppermost surface of the central structure, of a phase change material that includes two solid state phases at an operational temperature; and a top electrode on the central structure and the phase change memory cell.

10. The phase change memory device of claim 9, wherein the central structure is in direct contact with the heater and thereby limits an interface area between the heater and the phase change memory cell.

11. The phase change memory device of claim 9, wherein the first material has a resistivity at the operational temperature that is between a resistivity of a first phase of the phase change material at the operational temperature and a resistivity of a second phase of the phase change material at the operational temperature.

12. The phase change memory device of claim 11, wherein the first material is titanium nitride and the phase change material is a germanium-antimony-tellurium alloy.

13. The phase change memory device of claim 9, wherein the central structure and the phase change memory cell are etched to a pillar structure.

14. The phase change memory device of claim 9, wherein the phase change memory cell runs along an entire height of sidewalls of the central structure.

15. A phase change memory device, comprising: a bottom electrode; a heater positioned on the bottom electrode; a central structure on the heater, the central structure formed from a first material with a first resistivity and having a lowermost surface that is above an uppermost surface of the heater; a phase change memory cell, formed around the central structure and on the heater and having an uppermost surface that extends no higher than an uppermost surface of the central structure, of a phase change material that includes two solid state phases at an operational temperature that has a first phase with a resistivity higher than the first resistivity and a second phase with a resistivity lower than the first resistivity; and a top electrode on the central structure and the phase change memory cell.

16. The phase change memory device of claim 15, wherein the central structure is in direct contact with the heater and thereby limits an interface area between the heater and the phase change memory cell.

17. The phase change memory device of claim 16, wherein the first material is titanium nitride and the phase change material is a germanium-antimony-tellurium alloy.

18. The phase change memory device of claim 15, wherein the central structure and the phase change memory cell are etched to a pillar structure.

19. The phase change memory device of claim 15, wherein the phase change memory cell runs along an entire height of sidewalls of the central structure.

* * * * *